(12) United States Patent
Cheng et al.

(10) Patent No.: US 8,742,504 B2
(45) Date of Patent: Jun. 3, 2014

(54) FULLY-DEPLETED SON

(71) Applicant: International Business Machines Corporation, Armonk, NY (US)

(72) Inventors: Kangguo Cheng, Schenectady, NY (US); Bruce B. Doris, Slingerlands, NY (US); Pranita Kerber, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/891,636

(22) Filed: May 10, 2013

(65) Prior Publication Data
US 2013/0240993 A1    Sep. 19, 2013

Related U.S. Application Data

(62) Division of application No. 13/048,977, filed on Mar. 16, 2011, now Pat. No. 8,455,308.

(51) Int. Cl.
*H01L 27/12* (2006.01)

(52) U.S. Cl.
USPC .......................................... 257/347; 257/348

(58) Field of Classification Search
USPC ................... 257/347–354, E27.112, E29.147
See application file for complete search history.

(56) References Cited

U.S. PATENT DOCUMENTS

| | | | |
|---|---|---|---|
| 6,537,894 B2 | 3/2003 | Skotnicki et al. | |
| 6,800,518 B2 | 10/2004 | Bendernagel et al. | |
| 7,015,147 B2 | 3/2006 | Lee et al. | |
| 7,018,882 B2 | 3/2006 | Tweet et al. | |
| 7,078,298 B2 | 7/2006 | Lee et al. | |
| 7,273,788 B2 | 9/2007 | Forbes | |
| 7,306,997 B2 | 12/2007 | Xiang et al. | |
| 7,399,663 B2 | 7/2008 | Hoentschel et al. | |
| 7,569,434 B2 | 8/2009 | Cheng et al. | |
| 7,605,025 B2 | 10/2009 | Kim et al. | |
| 8,138,523 B2 | 3/2012 | Bedell et al. | |
| 8,304,301 B2 | 11/2012 | Cheng et al. | |
| 8,574,970 B2 * | 11/2013 | Cheng et al. | 438/300 |
| 2007/0194353 A1 | 8/2007 | Snyder | |

OTHER PUBLICATIONS

J. Pretet et al.,"Silicon-on-Nothing MOSFETs: Performance, Short-Channel Effects, and Backgate Coupling," IEEE Trans on Electron Devices, vol. 51, No. 2, Feb. 2004, pp. 240-245.
M. Jurczak et al.,"Silicon-on-Nothing (SON)—an innovation process for advanced CMOS," IEEE Trans on Electron Devices, vol. 47, Issue 11, Nov. 2000, pp. 2179-2187.
T. Skotnicki, et al.,"Silicon-on-Nothing (SON) techonology," 8th International Conference on ICSICT, Oct. 23-26, 2006, p. 11-14.

* cited by examiner

*Primary Examiner* — Cuong Q Nguyen
(74) *Attorney, Agent, or Firm* — Cantor Colburn LLP; Vazken Alexanian

(57) ABSTRACT

A semiconductor device and a method of fabricating a semiconductor device. The semiconductor device includes a semiconductor substrate, an insulating layer, a first semiconductor layer, a dielectric layer, a second semiconductor layer, a source and drain junction, a gate, and a spacer. The method includes the steps of forming a semiconductor substrate, forming a shallow trench isolation layer, growing a first epitaxial layer, growing a second epitaxial layer, forming a gate, forming a spacer, performing a reactive ion etching, removing a portion of the first epitaxial layer, filling the void with a dielectric, etching back a portion of the dielectric, growing a silicon layer, implanting a source and drain junction, and forming an extension.

12 Claims, 13 Drawing Sheets

FULLY-DEPLETED SON

CROSS-REFERENCE TO RELATED APPLICATION

This application is a divisional of U.S. patent application Ser. No. 13/048,977, filed Mar. 16, 2011, the disclosure of which is incorporated by reference herein in its entirety.

BACKGROUND

The present invention relates to a semiconductor device and a method of fabricating the same. More particularly, the present invention relates to a fully-depleted silicon-on-nothing (SON) device.

Electronic devices are widely used in almost all aspects of life. These devices are getting smaller; thus the circuitry inside the devices is also being downscaled. In order to maintain this trend, new ways to reduce the size of field effect transistors, such as metal-oxide semiconductor field effect transistors and complementary metal-oxide semiconductors, need to be developed. The smaller circuitry also needs to perform better than its larger counterparts.

One of the developments in downscaled semiconductor technology is extremely-thin silicon-on-insulator (ETSOI) devices. ETSOI devices have a number of advantages. However, the thickness variation in ETSOI leads to Vt roll-off and sub-threshold slope variability, especially for a gate length less than 25 nm. Silicon-on-nothing (SON) devices offer controlled, epitaxially-grown silicon channel disposed on an insulator layer. However, unlike ETSOI, these devices have a source and a drain on a bulk substrate, causing significant leakage current below the insulator layer. Moreover, conventional SON devices have dopant segregation in the floating dielectric resulting in lower effective dose and higher extension region resistance.

The proposed invention describes a fully-depleted SON device with better short-channel characteristics than partially-depleted/conventional SON devices. The structure includes an undoped-SON on an undoped-thin-SOI substrate. The structure eliminates the need for well implants, provides better Vt roll-off and lower off-state current compared to conventional SON.

SUMMARY

The present invention provides a fully-depleted silicon-on-nothing device and the method of fabricating such device. The present invention etches back the floating dielectric region before the extension implant to reduce/eliminate dopant segregation in the extension region. Removal of the dielectric beneath the extension region thereby minimizes any negative dopant segregation effects.

According to an aspect of the present invention, a semiconductor device is provided. The semiconductor device includes a semiconductor substrate, an insulating layer on the substrate, a first semiconductor layer on the insulating layer, a dielectric layer on a portion of the first semiconductor layer, a second semiconductor layer around the dielectric layer, a source and drain junction within the second semiconductor layer, a gate on a portion of the second semiconductor layer, and a spacer disposed around the gate and covering a portion of the second semiconductor layer.

According to another aspect of the present invention, a method of fabricating a semiconductor device is provided. The method includes the steps of forming a semiconductor substrate, forming a shallow trench isolation layer around the semiconductor device, growing a first epitaxial layer on the substrate, growing a second epitaxial layer on the first epitaxial layer, forming a gate on the second epitaxial layer, forming a spacer disposed on each side of the gate and on the second epitaxial layer, recessing the semiconductor substrate, first epitaxial layer and second epitaxial layer, removing at least a portion of the first epitaxial layer to create a void, filling the void with a dielectric material, etching back at least a portion of the dielectric material, growing a semiconductor layer around the dielectric material, forming a source and drain junction on the silicon on insulator, and forming an extension surrounded by the spacer.

DETAILED DESCRIPTION

The following describes embodiments of the present invention with reference to the drawings. The embodiments are illustrations of the invention, which can be embodied in various forms. The present invention is not limited to the embodiment described below, rather representative for teaching one skilled in the art how to make and use it. Some aspects of the drawings repeat from one drawing to the next. The aspects retain their same numbering from their first appearance throughout each of the preceding drawings.

In one embodiment of the present invention, a fully-depleted silicon-on-nothing (SON) semiconductor device is described. The fully depleted SON device includes a silicon channel disposed on a first insulating layer, a gate disposed on top of the channel, and a source and a drain disposed on a second insulating layer. The first insulating layer and the second insulating layer are separated by another semiconductor layer. The fully-depleted SON device is configured in such a way that when the device is off, both the channel layer and the semiconductor layer between the first insulating layer and the second insulating layer are depleted to minimize the leakage current between source and drain.

A silicon-on-nothing device (SON) is referred to as such because the removal of an epitaxial layer creates a void or an air tunnel isolating a semiconductor layer from another epitaxial layer. The device does not collapse, despite the void that is created, because it connects the active area of the semiconductor device and is supported at both ends by the shallow trench isolation layer. The void is filled with a dielectric material to prevent it from filling with the material on the surrounding sides while the device formation is completed.

Figure 1:
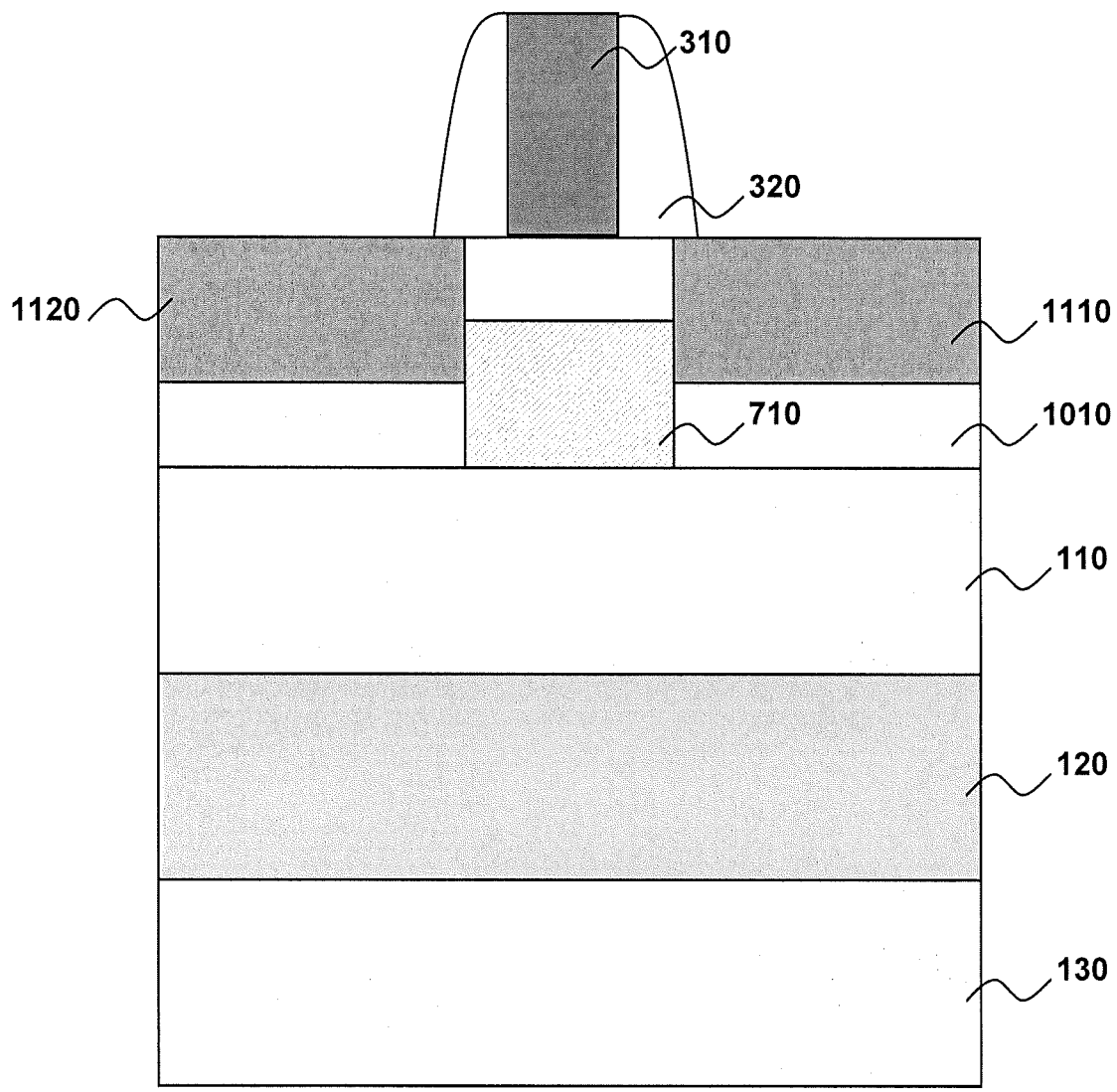
FIG. 1 depicts a cross-section of the completed fully depleted SON device.

FIG. 1 depicts the fully depleted SON device. The thickness of the different layers of the SON device, as indicated below, assist in achieving better device electrostatics. The aspects of the SON will be described with respect to the remaining drawings.

Figure 2:
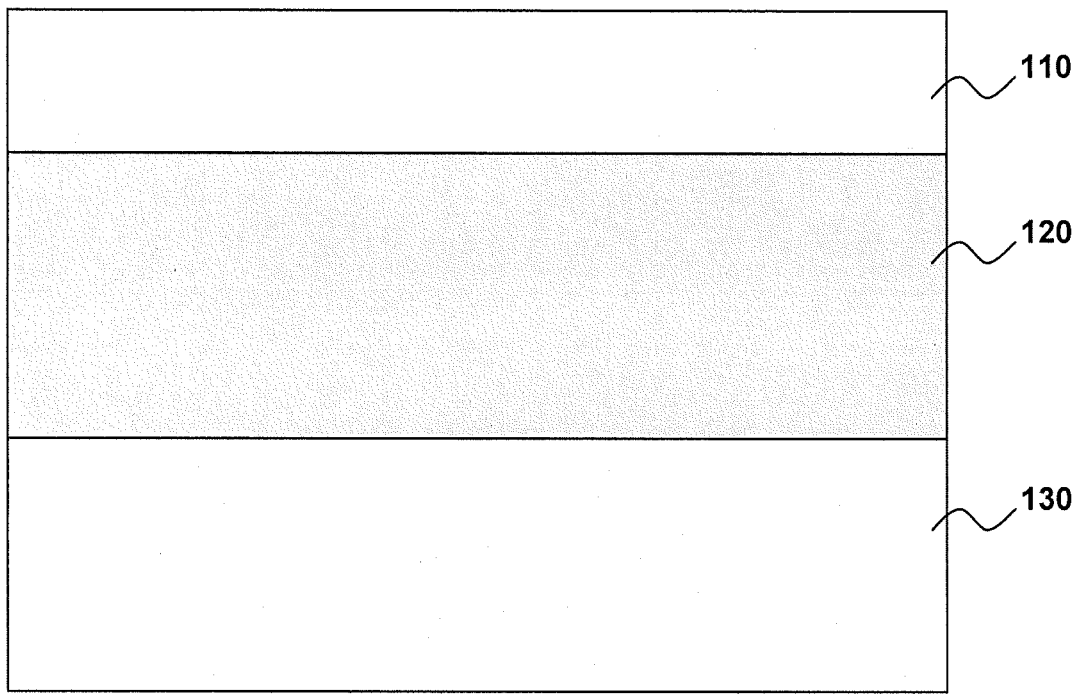
FIG. 2 illustrates a cross-section of an initial semiconductor substrate.

FIG. 2 depicts the initial semiconductor substrate for fabricating a fully-depleted silicon-on-nothing (SON) device. The substrate includes a semiconductor substrate (130), an insulating layer (120) and a first semiconductor layer (110).

The insulating layer (120) can include a single layer of insulating material or multiple layers with different insulating materials. Examples of insulating materials include, but are not limited to, silicon oxide, silicon nitride, silicon oxynitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. Preferably, the insulating layer (120) is silicon oxide (buried oxide).

The semiconductor substrate (130) can be made of such materials as germanium, silicon germanium, silicon carbide, a compound of Group III/V elements or a compound of Group II/VI elements. Preferably, the semiconductor substrate (130) is silicon (Si) and the first semiconductor layer (110) is a silicon-on-insulator (SOI) layer. The first semiconductor layer (110) is preferably of a size in the range of 10-30 nm.

Figure 3:
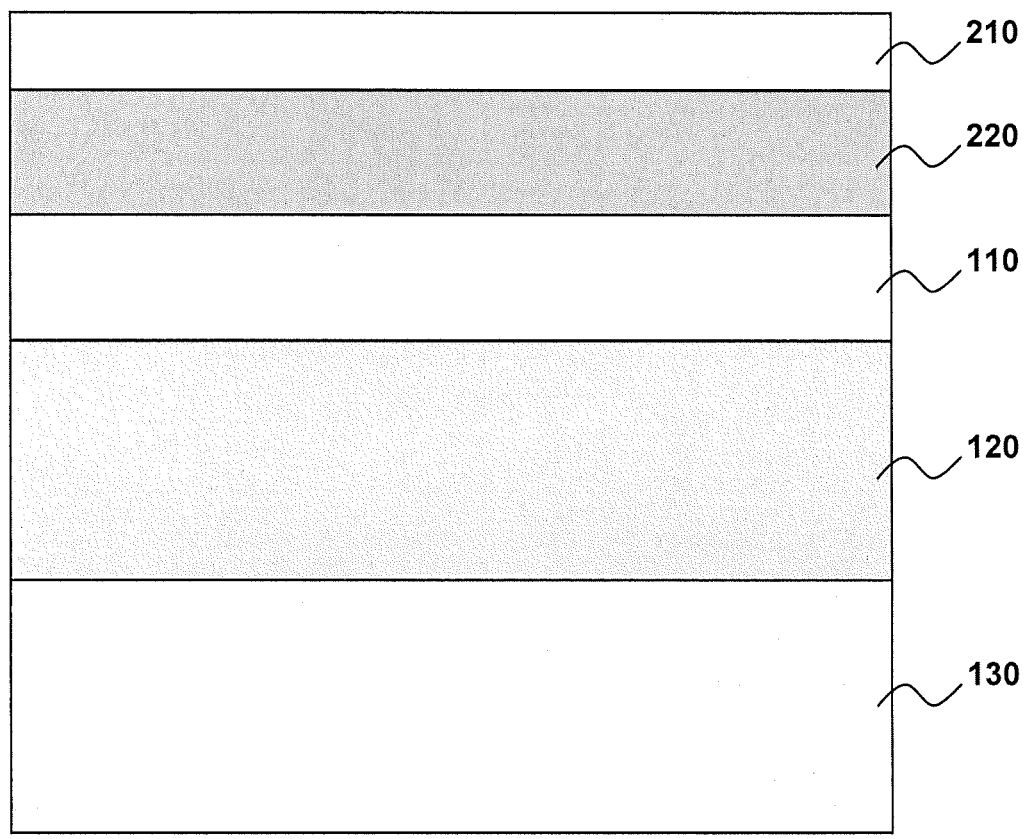
FIG. 3 illustrates a cross-section of a first and a second epitaxial layer on the initial substrate.

FIG. 3 continues to build the fully-depleted SON by including a first epitaxial layer (220) and a second epitaxial layer (210). The first epitaxial layer (220) is preferably made of silicon-germanium. This layer acts as a place holder for the "nothing" between the second epitaxial layer (210) and the first semiconductor layer (110). The second epitaxial layer (210) is preferably made of Si. The first epitaxial layer (220) and the second epitaxial layer (210) can be formed by an epitaxial growth process such as chemical vapor deposition (CVD). Preferably, the first epitaxial layer (220) has a thickness ranging from 10 nm to 50 nm and the second epitaxial layer (210) has a thickness ranging from 2 nm to 10 nm. However, a thickness of either epitaxial layer that is greater or less than the preferred thickness is also conceived.

Figure 4:
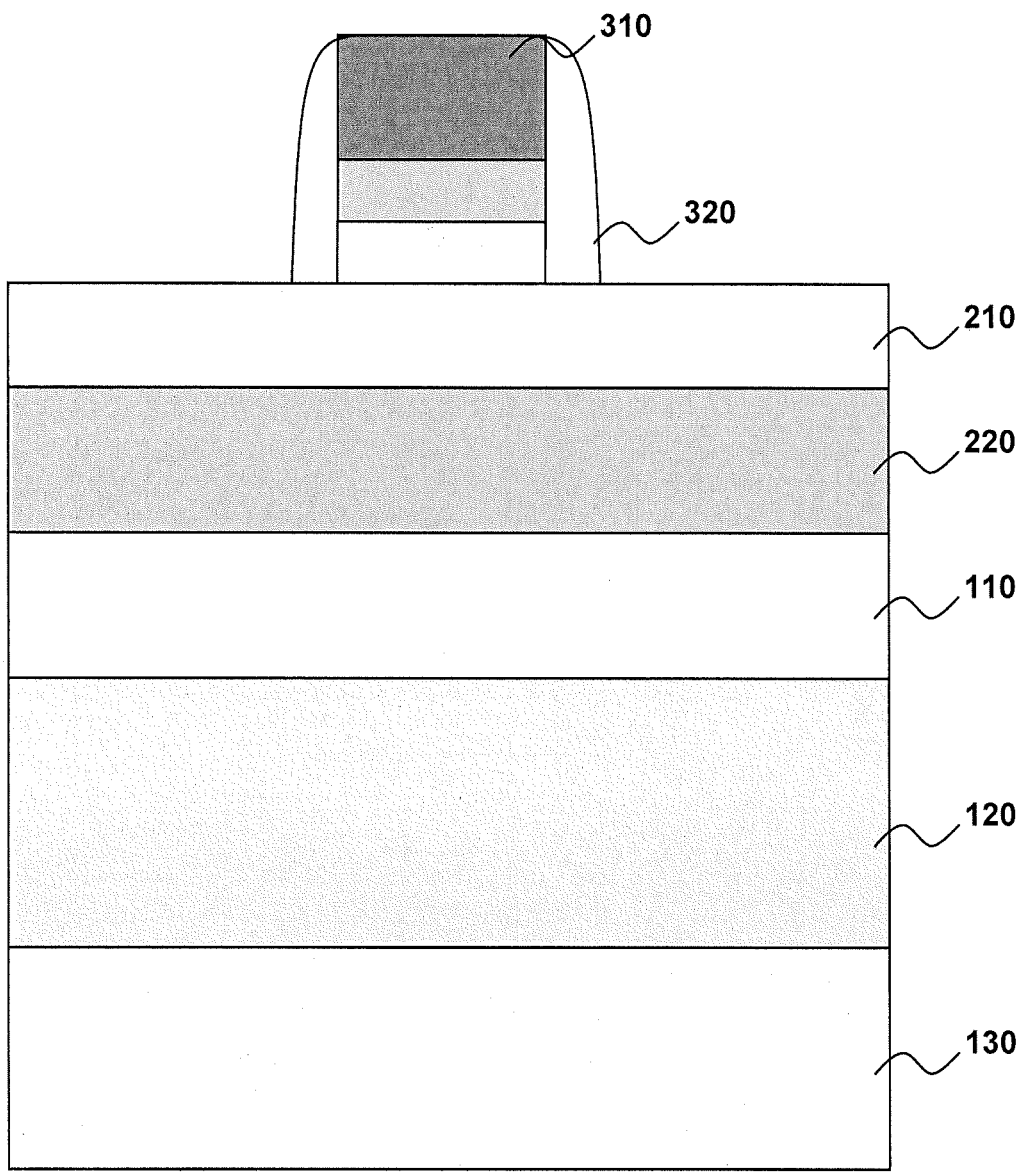
FIG. 4 illustrates a cross-section of a gate surrounded by spacers on the substrate in FIG. 2.
Figure 5:
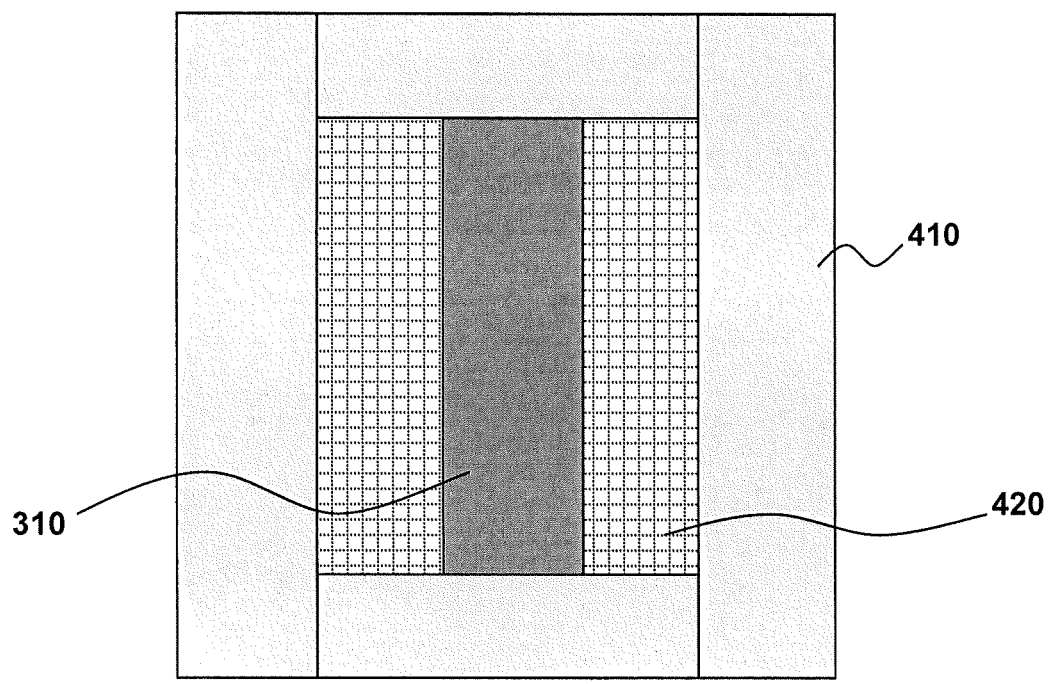
FIG. 5 illustrates a shallow trench isolation layer around a semiconductor device.

Furthermore, FIG. 4 shows a gate (310), which has a spacer (320) around it. The gate (310) and the spacer (320) are positioned on the second epitaxial layer (210). The gate (310) can include at least one gate dielectric layer, for example a high-k dielectric, and at least one gate conducting layer, for example a metal or conductive metallic compound. An active semiconductor device area (420) of the SON device is surrounded by a shallow trench isolation (STI) layer (410), as shown in FIG. 5. The gate (310) is shown as being above the active area.

The shallow trench isolation (STI) layer helps to prevent current leakage in the SON device as the device is fabricated. Moreover, the STI layer helps to hold the layers of the device in place during the fabrication of the semiconductor device. The STI layer includes etched trenches around the semiconductor device, which are filled with a dielectric material.

Figure 6:
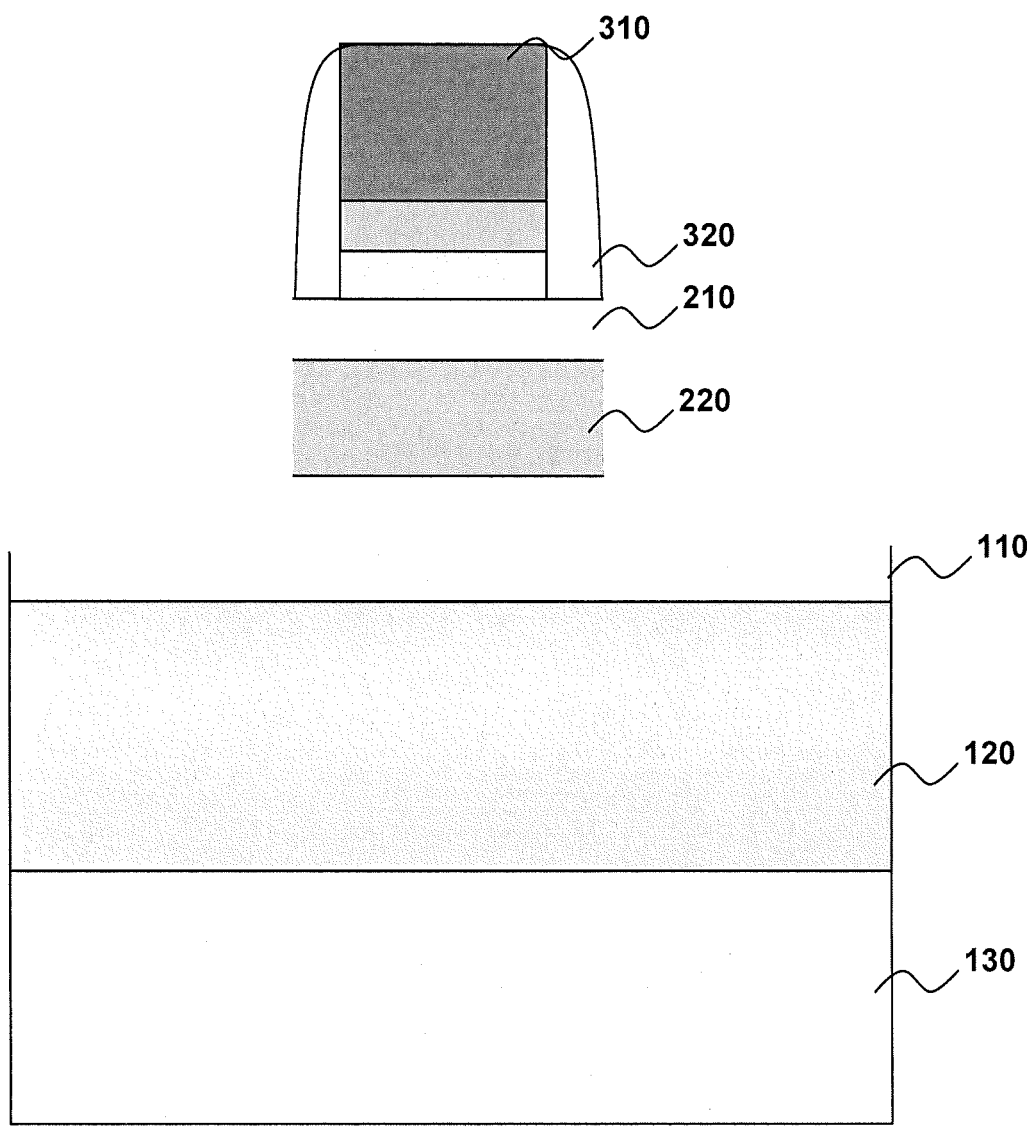
FIG. 6 illustrates a recessing of the substrate.
Figure 7:
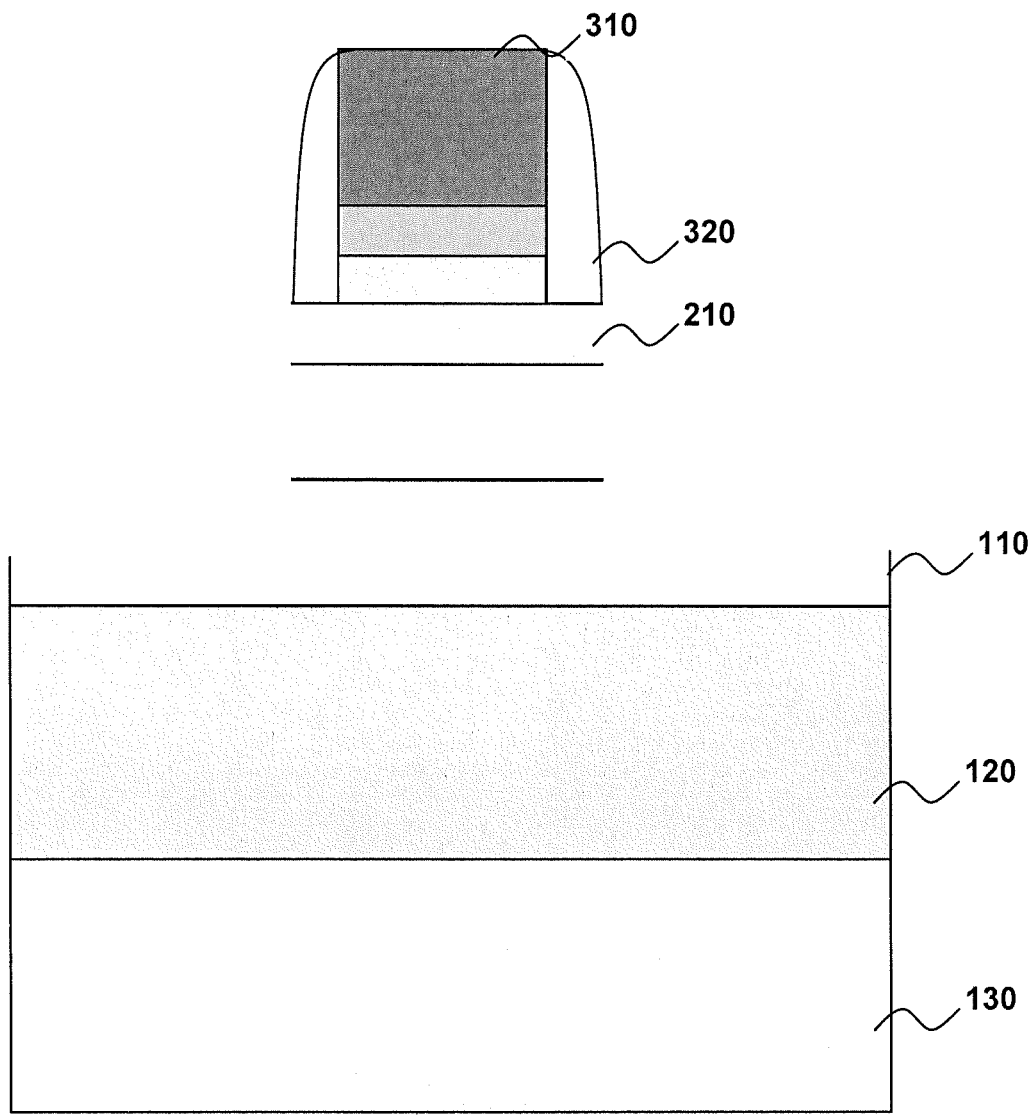
FIG. 7 illustrates a void between the initial substrate and the second epitaxial layer.

In FIG. 6, the SON device is shown with the first semiconductor layer (110), the first epitaxial layer (220) and the second epitaxial layer (210) etched back. The first epitaxial layer (220) is further etched back selective to the second epitaxial layer (210) and the first semiconductor layer (110) in FIG. 7. In one embodiment, the first epitaxial layer (220) includes silicon germanium, and the second epitaxial layer (210) and the first semiconductor layer (110) include silicon. The first epitaxial layer (220) is etched in a gas environment containing hydrochloride. At least a portion of the first epitaxial layer (220) is fully removed between the second epitaxial layer (210) and the first semiconductor layer (110). Preferably, the entire first epitaxial layer (220) is etched back to the second epitaxial layer (210).

Figure 8:
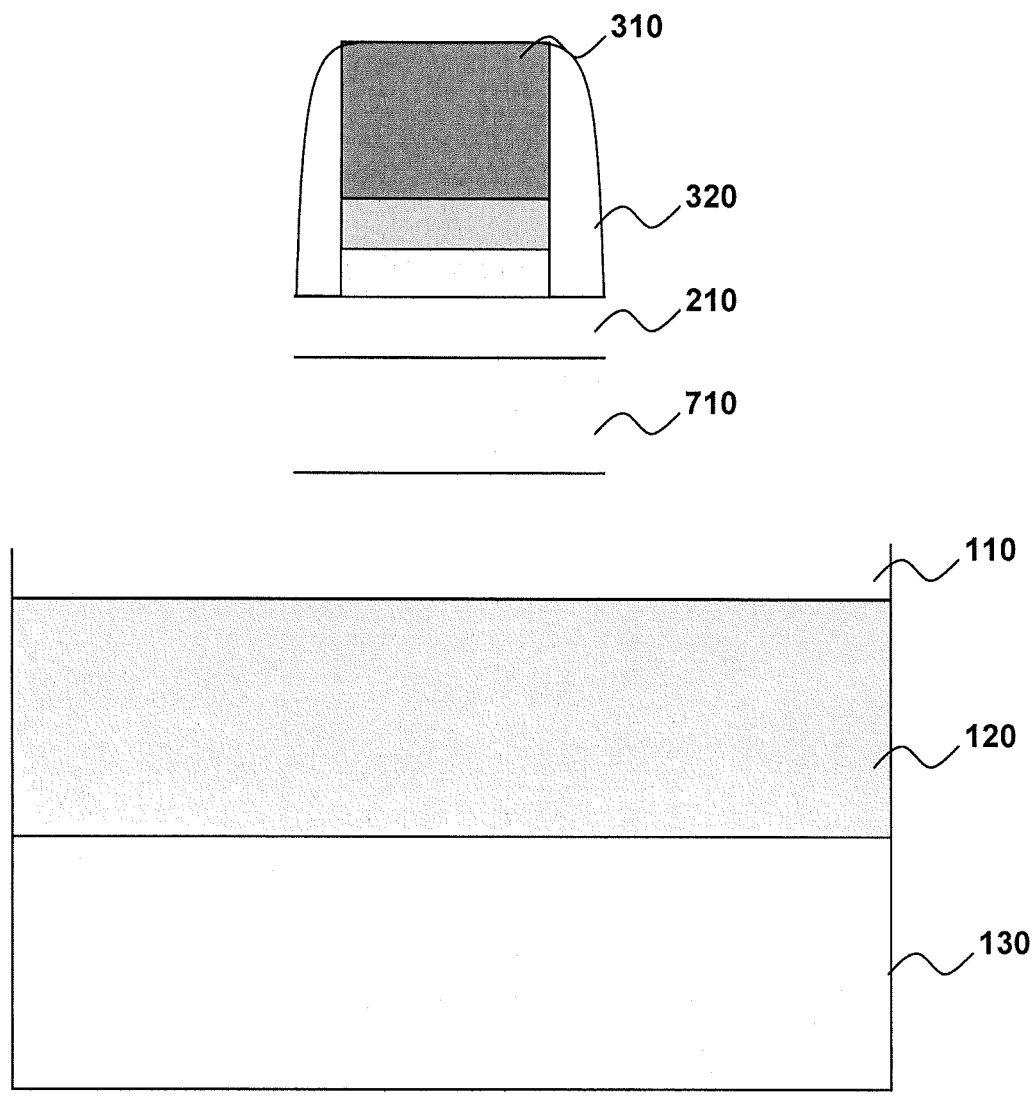
FIG. 8 illustrates a dielectric material between the initial substrate and the second epitaxial layer.
Figure 9:
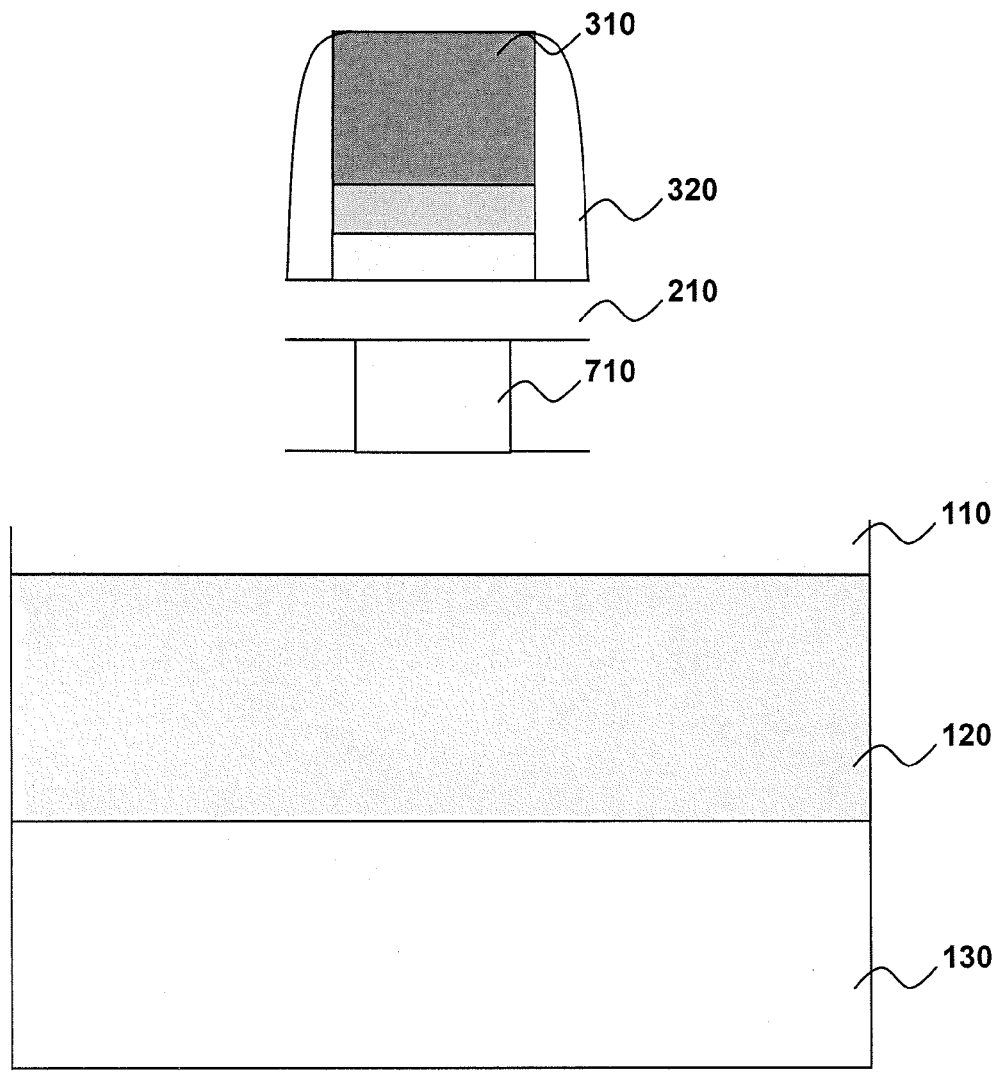
FIG. 9 illustrates the structure of FIG. 8 with a portion of the dielectric material etched back.
Figure 10:
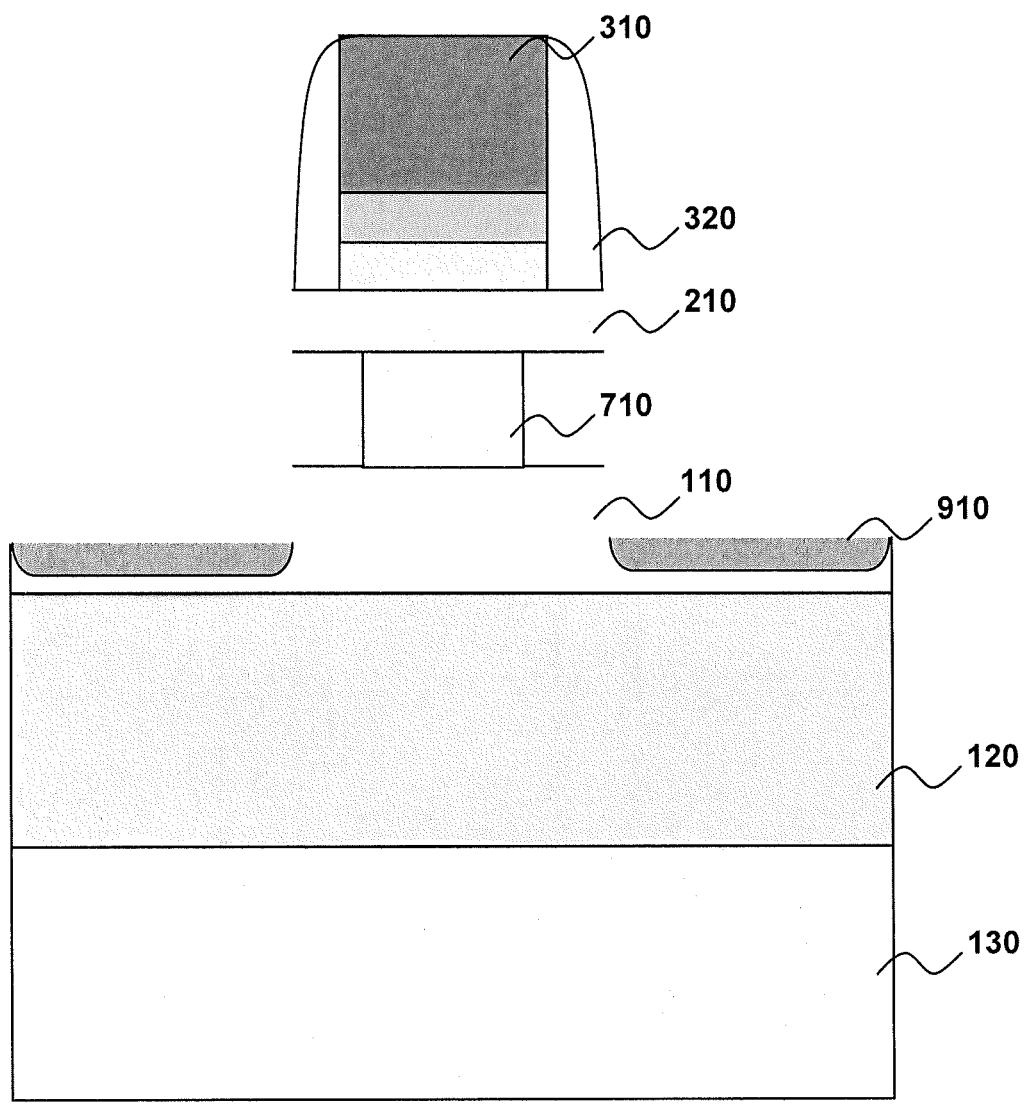
FIG. 10 illustrates the structure of FIG. 9 with an implant area for junction butting.

A void is created between the second epitaxial layer (210) and the first semiconductor layer (110) after the first epitaxial layer (220) has been etched back. The void is filled by a dielectric material (710), as shown in FIG. 8. FIG. 9 shows that at least a portion of the dielectric (710) is also etched back. The etching of the dielectric (710) reduces it to a size in the range of 10-25 nm. The dielectric (710) is etched to about 3-5 nm shorter than the length of the gate (310). The thickness of the dielectric (710) assists in achieving better device electrostatics. The dielectric (710) can include a single or multiple layered dielectric materials including, but not limited to, silicon oxide, silicon nitride, silicon oxynitride, and high-k dielectric. An implant (910) for junction butting also can be included in the SON device, shown in FIG. 10.

Figure 11:
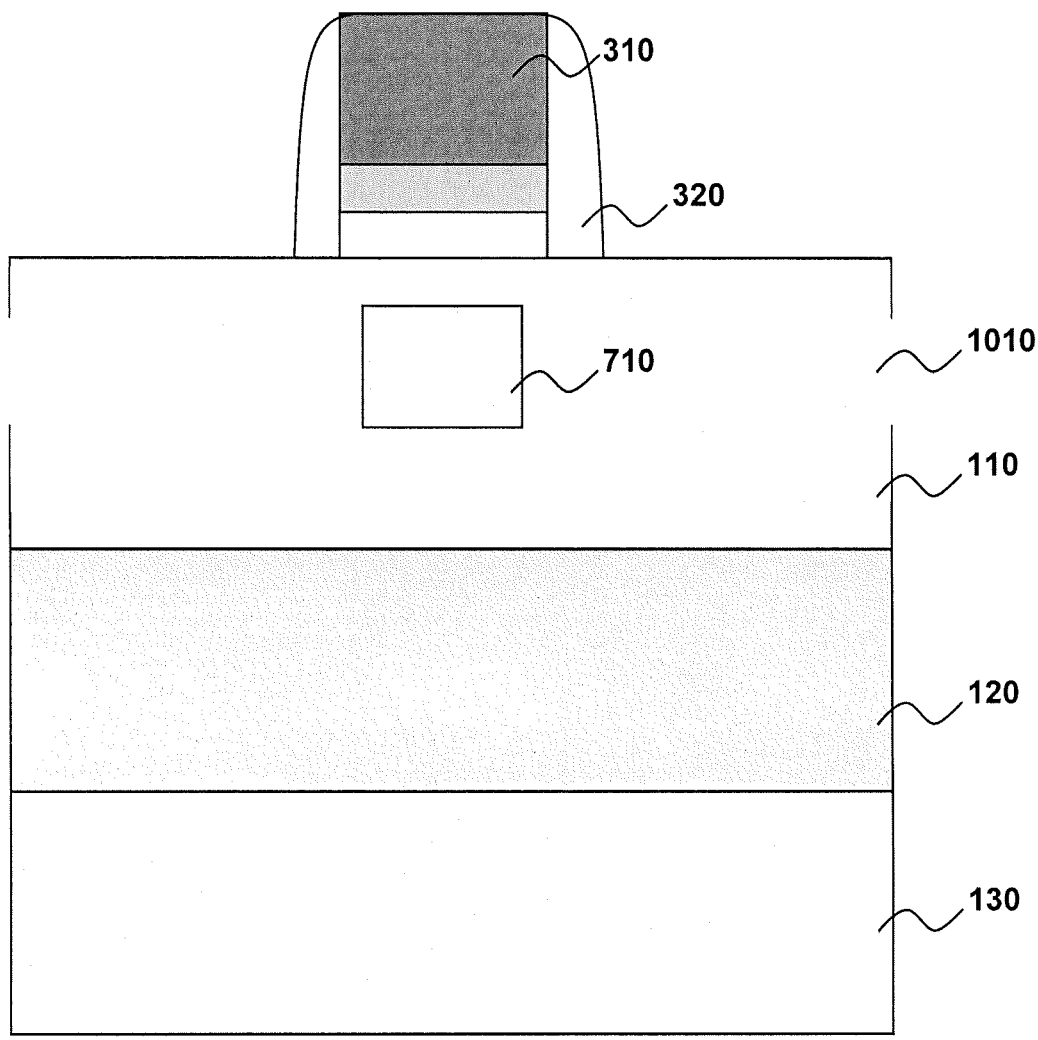
FIG. 11 illustrates the structure of FIG. 9 with the etched areas filled with a new material.
Figure 12:
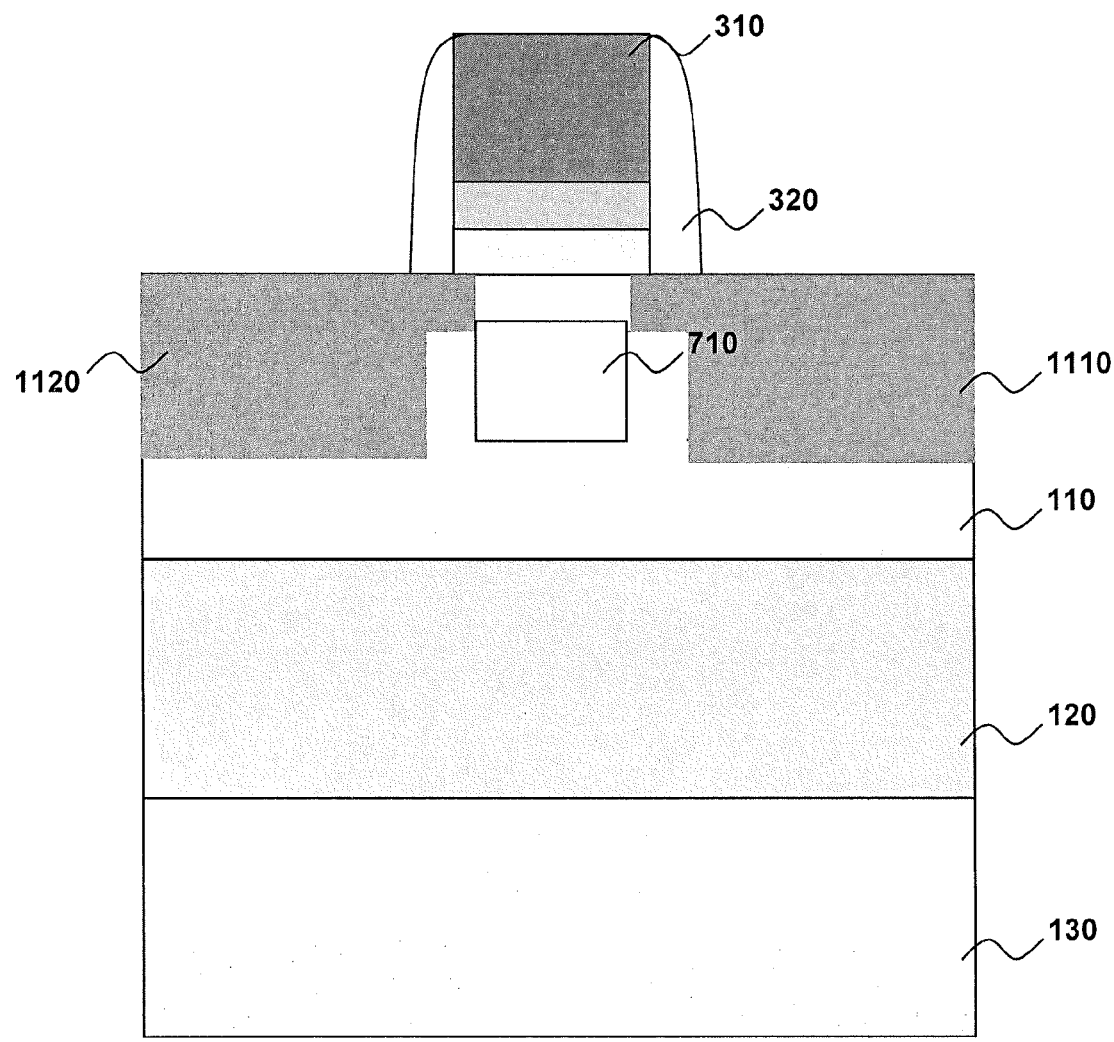
FIG. 12 illustrates the structure of FIG. 11 with an extension and a source and drain junction.
Figure 13:
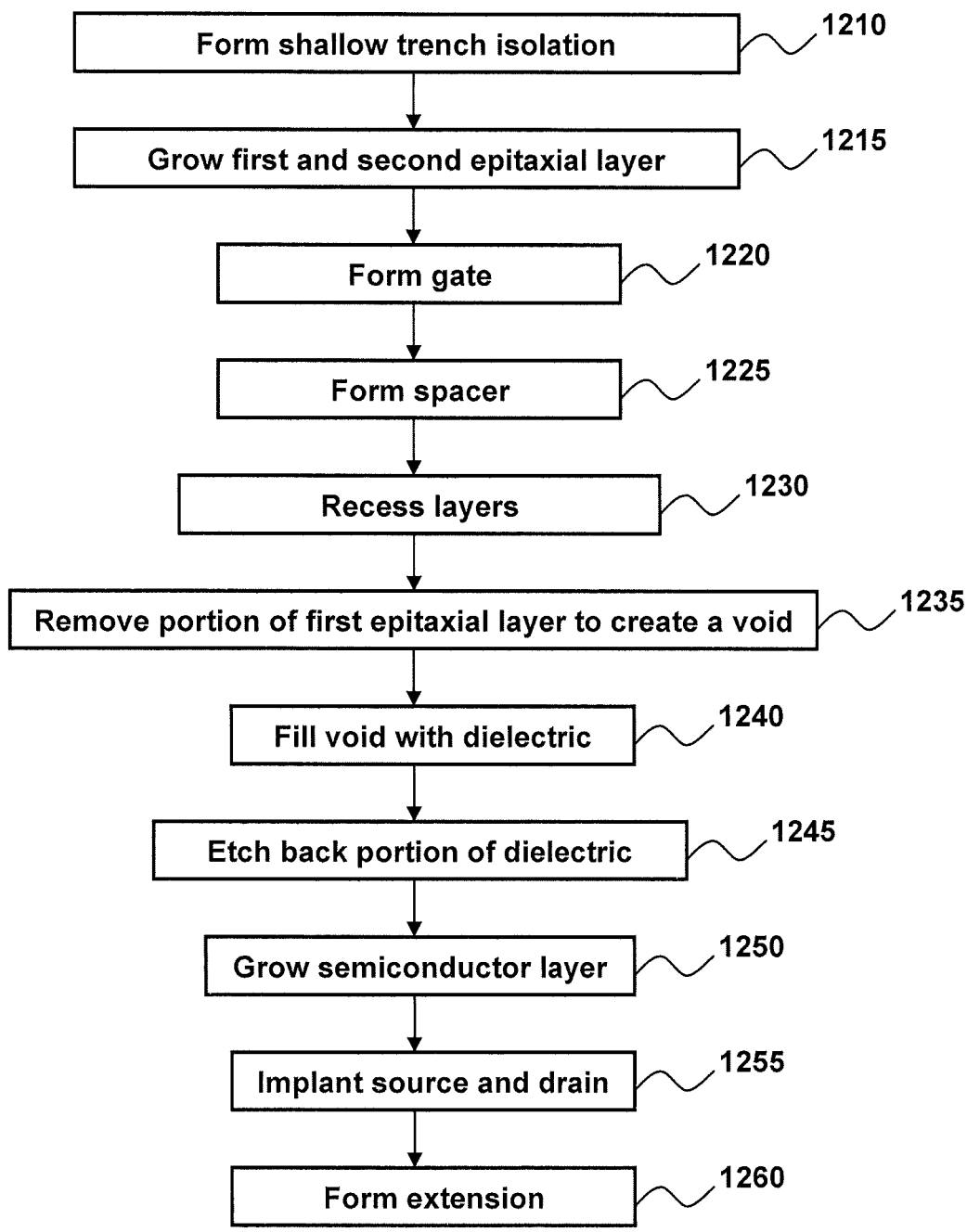
FIG. 13 is a flow chart illustrating the steps of fabricating the device in FIG. 1.

In FIG. 11, the remainder of the void created by the etch processes is filled with a second semiconductor layer (1010), for example, by an epitaxial growth process. The second semiconductor layer (1010) can include silicon, silicon germanium, germanium, carbon doped silicon, Group II/V compound semiconductor, Group II/VI compound semiconductor, or any suitable combination of those materials. The second semiconductor layer (1010) has a thickness in the range of 2-10 nm. To complete the fully-depleted SON device a source (1120) and a drain (1110) created in the second semiconductor layer (1010), as shown in FIG. 12. The source (1120) and drain (1110) can be formed by implantation. The fully-depleted SON device can be made and used with or without the implant (910) for junction butting.

In another embodiment of the present invention, a method of fabricating the fully-depleted SON semiconductor device is described. The method assists in creating a well controlled dielectric under the channel of the SON device. The method also creates a uniform thickness in the channel, thus the thickness is well controlled. Therefore, there the method prevents dopant segregation thereby allowing higher activation in the device.

In order to fabricate the device, a semiconductor substrate should be provided. Preferably, the substrate is a SOI substrate. In step 1210, a shallow trench isolation layer is formed around the semiconductor substrate. A first and a second epitaxial layer are grown in step 1215. The first epitaxial layer is grown on the semiconductor substrate and the second epitaxial layer is grown on the first epitaxial layer. A gate is formed in step 1220 and a spacer is formed around the gate in step 1225.

In step 1230, a recessing is performed in order to minimize the dimensions of the first epitaxial layer (220), the second epitaxial layer (210) and the first semiconductor layer (110). The recessing is preferably performed by a reactive ion etching process. The first epitaxial layer (220) is further reduced in step 1235 by removing at least a portion of it to create a void between the second epitaxial layer (210) and the first semiconductor layer (110). The void is filled with a dielectric material (710) in step 1240. At least a portion of the dielectric (710) is etched back in step 1245 in order to achieve better performance of the device throughout its supporting layers. A second semiconductor layer (1010) is grown, in step 1250, in the void created by the etching processes. A source (1120) and a drain (1110) are formed in step 1255 and an extension is formed on the device in step 1260.

While the invention has been described in its preferred embodiments, it is to be understood that the invention is not limited to the embodiments. Rather, various changes in form and details can be made without departing from the spirit and scope of the invention as set forth in the claims.

The invention claimed is:

1. A semiconductor device, comprising:
   a semiconductor substrate;
   an insulating layer on the semiconductor substrate;
   a first semiconductor layer disposed on the insulating layer;
   a dielectric layer disposed on a portion of the first semiconductor layer;
   a second semiconductor layer disposed around the dielectric layer;
   a source and drain junction disposed within the second semiconductor layer;
   a gate disposed on a portion of the second semiconductor layer; and
   a spacer disposed around the gate and covering a portion of the second semiconductor layer.

2. The semiconductor device of claim 1, wherein the first semiconductor layer has a thickness from about 10 nanometers to about 30 nanometers.

3. The semiconductor device of claim 1, wherein the second semiconductor layer is made of a material selected from the group consisting of: silicon, germanium, a compound of a Group III/V elements, a compound of a Group II/VI elements, and a combination thereof.

4. The semiconductor device of claim 1, wherein the second semiconductor layer has a thickness of about 2 nanometers to about 10 nanometers.

5. The semiconductor device of claim 1, wherein the dielectric layer is a single-layer dielectric.

6. The semiconductor device of claim 1, wherein the dielectric layer is a multi-layer dielectric.

7. The semiconductor device of claim 1, wherein the dielectric layers has a thickness of about 10 nanometers to about 25 nanometers.

8. The semiconductor device of claim 1, wherein there is an implant for junction butting disposed beneath the source and drain junction.

9. The semiconductor device of claim 1, wherein the dielectric layer is about 3 nanometers to about 5 nanometers shorter than the length of the gate.

10. The semiconductor device of claim 1, wherein the first semiconductor layer is a silicon-on-insulator layer.

11. The semiconductor device of claim 1, wherein the dielectric layer is made of a material selected from the group consisting of silicon oxide, silicon nitride, silicon oxynitride and a high-k dielectric.

12. The semiconductor device of claim 1, wherein the gate comprises at least one gate dielectric layer and at least one gate conducting layer.

* * * * *